United States Patent
Ogawa

(10) Patent No.: US 9,082,747 B2
(45) Date of Patent: Jul. 14, 2015

(54) METHOD, APPARATUS, AND NON-TRANSITORY COMPUTER READABLE RECORDING MEDIUM FOR MANUFACTURING A SEMICONDUCTOR DEVICE WITH AN AMORPHOUS OXIDE FILM

(71) Applicant: Hitachi Kokusai Electric Inc., Tokyo (JP)

(72) Inventor: Arito Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/036,846

(22) Filed: Sep. 25, 2013

(65) Prior Publication Data

US 2014/0084389 A1    Mar. 27, 2014

(30) Foreign Application Priority Data

Sep. 26, 2012    (JP) .................................. 2012-212464

(51) Int. Cl.
*H01L 29/40* (2006.01)
*C23C 16/52* (2006.01)
(Continued)

(52) U.S. Cl.
CPC ............ *H01L 29/408* (2013.01); *C23C 16/403* (2013.01); *C23C 16/405* (2013.01); *C23C 16/45529* (2013.01); *C23C 16/45531* (2013.01); *C23C 16/52* (2013.01);
(Continued)

(58) Field of Classification Search
CPC .............. H01L 29/408; H01L 21/0228; H01L 21/02181; H01L 21/02194; H01L 21/02178; H01L 29/513; H01L 29/66833; C23C 16/45529; C23C 16/45531; C23C 16/405; C23C 16/403; C23C 16/52
See application file for complete search history.

(56) References Cited

U.S. PATENT DOCUMENTS 7,312,494 B2 * 12/2007 Ahn et al. ...................... 257/310
7,550,347 B2 *  6/2009 Choi et al. ..................... 438/257
(Continued)

FOREIGN PATENT DOCUMENTS

| JP | 2004161602 | 6/2004 |
| JP | 2008-98641 | 4/2008 |
| KR | 1020110013319 | 2/2011 |

OTHER PUBLICATIONS

Office Action in corresponding Korean Application No. 10-2013-0111850, dated Oct. 22, 2014, along with an English translation.

*Primary Examiner* — William Coleman
(74) *Attorney, Agent, or Firm* — Edell, Shapiro & Finnan LLC

(57) ABSTRACT

Provided are a semiconductor device manufacturing method by which a semiconductor device in which a threshold voltage is suppressed from changing can be manufactured, a substrate processing method and apparatus, a non-transitory computer-readable recording medium, and the semiconductor device. The semiconductor device manufacturing method includes forming an amorphous first oxide film including a first element on a substrate, and modifying the first oxide film to an amorphous second oxide film including the first element and a second element different from the first element by adding the second element to the first oxide film. The first element includes at least one element selected from a group consisting of aluminum, yttrium and lanthanum. A concentration of the second element in the second oxide film is controlled to be lower than that of the first element in the second oxide film.

16 Claims, 7 Drawing Sheets

(51) Int. Cl.
*H01L 29/51* (2006.01)
*H01L 29/66* (2006.01)
*C23C 16/40* (2006.01)
*C23C 16/455* (2006.01)
*H01L 21/02* (2006.01)

(52) U.S. Cl.
CPC ..... *H01L 21/0228* (2013.01); *H01L 21/02178* (2013.01); *H01L 21/02181* (2013.01); *H01L 21/02194* (2013.01); *H01L 29/513* (2013.01); *H01L 29/66833* (2013.01)

(56) References Cited

U.S. PATENT DOCUMENTS

| | | | |
|---|---|---|---|
| 8,093,666 B2* | 1/2012 | Ahn et al. | 257/410 |
| 8,309,955 B2* | 11/2012 | Katz et al. | 257/40 |
| 8,531,000 B2* | 9/2013 | Yoneda | 257/506 |
| 8,686,490 B2* | 4/2014 | Chen | 257/324 |
| 2007/0281426 A1* | 12/2007 | Wang | 438/261 |
| 2012/0025297 A1* | 2/2012 | Takashima et al. | 257/324 |

* cited by examiner

//  METHOD, APPARATUS, AND NON-TRANSITORY COMPUTER READABLE RECORDING MEDIUM FOR MANUFACTURING A SEMICONDUCTOR DEVICE WITH AN AMORPHOUS OXIDE FILM

CROSS REFERENCE TO RELATED APPLICATIONS

This application claims foreign priority under 35 U.S.C. §119(a)-(d) to Application No. JP 2012-212464 filed on Sep. 26, 2012, entitled "Method of Manufacturing Semiconductor Device, Substrate Processing Method and Apparatus, Non-Transitory Computer Readable Recording Medium, and Semiconductor Device," the entire contents of which are hereby incorporated by reference.

FIELD OF THE INVENTION

The present invention relates to a method of manufacturing a semiconductor device, a substrate processing method and apparatus, a non-transitory computer readable recording medium and a semiconductor device.

BACKGROUND

Recently, as semiconductor devices such as flash memories have become finer, application of a structure called a charge-trap type as a flash memory has been under investigation. Representative examples of a charge-trap type flash memory are a flash memory called a MONOS that uses a stack structure of a Metal/$SiO_2$/SiN/$SiO_2$/Si substrate (MONOS structure or MONOS type flash memory) and a flash memory called a TANOS that uses a stack structure of a TaN/$Al_2O_3$/SiN/$SiO_2$/Si substrate (TANOS structure or TANOS type flash memory) (Refer to Japanese Unexamined Patent Application Publication No. 2008-98641.)

However, the TANOS structure is disadvantageous in that the reliability thereof is low and a threshold voltage changes. When the threshold voltage changes, data is likely to be unable to be written or deleted, and thus an operation of a semiconductor device such as a flash memory may be negatively affected by the change in the threshold voltage.

SUMMARY

It is a main object of the present invention to provide a semiconductor device manufacturing method by which a semiconductor device, such as a charge-trap type flash memory, in which a threshold voltage is suppressed from changing can be manufactured, a substrate processing method and apparatus, a non-transitory computer-readable recording medium and the semiconductor device.

According to one aspect of the present invention, there is provided a method of manufacturing a semiconductor device, including: (a) forming an amorphous first oxide film including a first element on a substrate; and (b) modifying the first oxide film to an amorphous second oxide film including the first element and a second element different from the first element by adding the second element to the first oxide film, wherein the first element includes at least one element selected from a group consisting of aluminum, yttrium and lanthanum, and a concentration of the second element in the second oxide film is lower than that of the first element in the second oxide film.

According to another aspect of the present invention, there is provided a substrate processing method including: (a) forming an amorphous first oxide film including a first element on a substrate; and (b) modifying the first oxide film to an amorphous second oxide film including the first element and a second element different from the first element by adding the second element to the first oxide film, wherein the first element includes at least one element selected from a group consisting of aluminum, yttrium and lanthanum, and a concentration of the second element in the second oxide film is lower than that of the first element in the second oxide film.

According to still another aspect of the present invention, there is provided a substrate processing apparatus including: a process chamber accommodating a substrate therein; a first source gas supply system configured to supply a first source gas including at least a first element onto the substrate in the process chamber, wherein the first element is selected from the group consisting of aluminum, yttrium and lanthanum; a second source gas supply system configured to supply a second source gas onto the substrate in the process chamber, wherein the second source gas includes a second element different from the first element, and the second source gas being different from the first source gas; an oxygen-containing gas supply system configured to supply an oxygen-containing gas onto the substrate in the process chamber; and a control unit configured to control the first source gas supply system, the second source gas supply system and the oxygen-containing gas supply system to perform: (a) forming an amorphous first oxide film including a first element on a substrate; and (b) modifying the first oxide film to an amorphous second oxide film including the first element and a second element different from the first element by adding the second element to the first oxide film in a manner that a concentration of the second element in the second oxide film is lower than that of the first element in the second oxide film.

According to yet another aspect of the present invention, there is provided a non-transitory computer-readable recording medium storing a program that causes a computer to perform: (a) forming a first oxide film including at least a first element on a substrate accommodated in a process chamber of a substrate processing apparatus, wherein the first element is selected from a group consisting of aluminum, yttrium and lanthanum; and (b) adding a second element different from the first element into the first oxide film formed on the substrate in a manner that a concentration of the second element in the first oxide film is lower than that of the first element in the first oxide film.

According to yet another aspect of the present invention, there is provided a semiconductor device including: a gate electrode; and an insulating film including an amorphous oxide film including a first element selected from a group consisting of aluminum, yttrium and lanthanum and a second element different from the first element, a concentration of the second element being lower than that of the first element.

DETAILED DESCRIPTION

First, the background of exemplary embodiments of the present invention will be described below.

Figure 1:
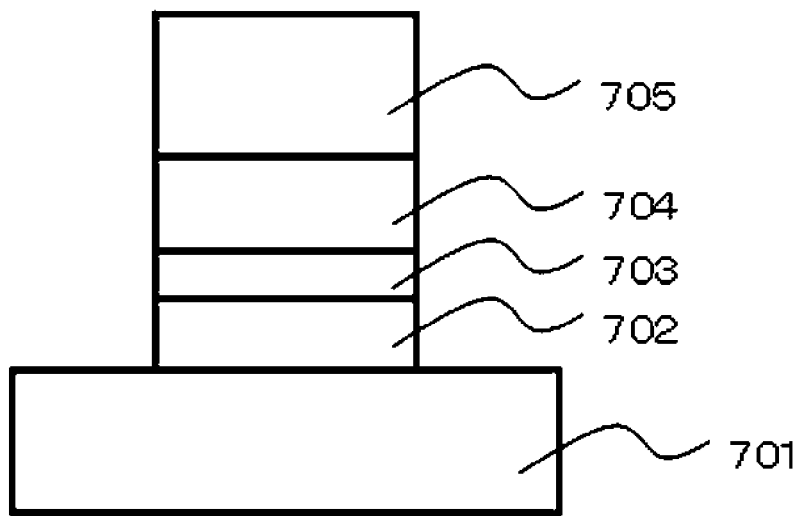
FIG. 1 is a block diagram of a semiconductor memory device to which a film obtained according to an exemplary embodiment of the present invention is applicable.

A structure of a charge-trap type flash memory which is a flash memory as an example of a semiconductor device will now be described with reference to FIG. 1. Here, a charge-trap type flash memory using a device structure called 'TANOS' which is an example of a charge flash memory will be described. In the charge-trap type flash memory using the TANOS structure, the TANOS structure is configured by mainly sequentially forming a tunneling oxide film 702, a charge trapping film 703, a blocking oxide film 704 and a gate electrode 705 on a substrate 701. For example, a silicon (Si) wafer is used as the substrate 701, a $SiO_2$ film (silicon oxide film) is used as the tunneling oxide film 702, a SiRN film (silicon-rich nitride film) which is a silicon nitride film is used as the charge trapping film 703, an $Al_2O_3$ film (aluminum oxide film) is used as the blocking oxide film 704, and a TaN film (tantalum nitride film) is used as the gate electrode 705.

In a semiconductor device such as the charge-trap type flash memory using the TANOS structure, it is shown that an $Al_2O_3$ film which is used as an insulating film, i.e., a blocking insulating film, in the charge-trap type flash memory is crystallized when the film is thermally treated at about 1000° C. and a threshold voltage changes due to hydrogen-related mobile electric charges at a grain boundary of the $Al_2O_3$ film. As described above, a change in the threshold voltage may be regarded as being due to crystallization of the $Al_2O_3$ film (aluminum oxide film) which is an insulating film.

The inventor of the present application has found that when a Hf-doped $Al_2O_3$ film is formed on a substrate by adding (doping) only a predetermined amount of hafnium (Hf) as a second element (which has an atomic radius greater than that of a first element and is different from the first element) into an $Al_2O_3$ film serving as a blocking insulating film containing aluminum (Al) as the first element, a semiconductor device such as a charge-trap type flash memory in which the Hf-doped $Al_2O_3$ film is not crystallized and remains in an amorphous state even after this film is thermally treated at about 1000° C. and a threshold voltage is suppressed from changing can be manufactured.

Exemplary embodiments set forth herein are based on the inventor's knowledge and discoveries described above. In particular, in the following embodiments, a Hf-doped $Al_2O_3$ film is formed on a substrate by adding (doping) only a predetermined amount of hafnium (Hf) as a second element different from a first element into an $Al_2O_3$ film which is an insulating film containing aluminum (Al) as the first element. Then, the Hf-doped $Al_2O_3$ film may not be crystallized and may be maintained in an amorphous state after it is then thermally treated at about 1000° C.

Hereinafter, exemplary embodiments of the present invention will be described with reference to the accompanying drawings.

First, a substrate processing apparatus that is preferably used in exemplary embodiments of the present invention will be described. The substrate processing apparatus is configured as an example of a semiconductor manufacturing apparatus used to manufacture a semiconductor device.

In the following description, a case in which a substrate processing apparatus which is a batch-type longitudinal apparatus capable of forming a film on a plurality of substrates at once is used as an example of the substrate processing apparatus will be described. However, the present invention is not limited thereto, and for example, a substrate processing apparatus which is a single-wafer apparatus capable of forming a film on one or several substrates at once may be used.

A process furnace 202 will now be described with reference to FIGS. 2 and 3.

Process Tube

The process furnace 202 includes a longitudinal process tube 205 serving as a reaction tube disposed in a vertical direction such that a central line thereof is vertically located and fixedly supported by a housing (not shown). The process tube 205 includes an inner tube 204 and an outer tube 203. The inner tube 204 and the outer tube 203 are each integrally formed of a heat-resistant material such as quartz ($SiO_2$) or silicon carbide (SiC) and in a cylindrical shape.

The inner tube 204 is formed in a cylindrical shape, the top end of which is closed and the bottom end of which is open. In the inner tube 204, a process chamber 201 is formed to accommodate and process a plurality of wafers 200 stacked in a horizontal posture and a multi-stage manner by a boat 217 which is a substrate retaining mechanism. A lower end opening of the inner tube 204 forms a furnace port via which the boat 217 retaining the plurality of wafers 200 is loaded into/unloaded from the process chamber 201. Thus, an internal diameter of the inner tube 204 is set to be greater than a maximum outer diameter of the boat 217 retaining the plurality of wafers 200. The outer tube 203 has a shape similar to that of the inner tube 204, has an internal diameter that is greater than an external diameter of the inner tube 204, has a cylindrical shape, the top end of which is closed and the bottom end of which is open, and is concentrically covered to encompass external sides of the inner tube 204. A lower end portion between the inner tube 204 and the outer tube 203 is air-tightly encapsulated with a manifold 209 formed in a circular ring shape. The manifold 209 is installed to be attachable to and detachable from the inner tube 204 and the outer tube 203 so as to repair, check, or clean the inner tube 204 and the outer tube 203. The process tube 205 is vertically installed by supporting the manifold 209 with the housing (not shown).

Exhaust Unit

An exhaust pipe 237 configured to exhaust an atmosphere in the process chamber 201 is connected to a portion of a sidewall of the manifold 209. An exhaust mechanism configured to exhaust an atmosphere in the process chamber 201 is formed at an interface between the manifold 209 and the exhaust pipe 237. The inside of the exhaust pipe 237 communicates into an exhaust passage which is a gap between the inner tube 204 and the outer tube 203, via the exhaust mechanism. A cross-section of the exhaust passage has a circular ring shape having a predetermined width. At the exhaust pipe 237, a pressure sensor 245, an auto pressure controller (APC) valve 231a serving as a pressure adjustment valve and a vacuum pump 231c serving as a vacuum exhaust device are sequentially installed starting from an upstream side. The vacuum pump 231c is configured to perform vacuum exhaust such that pressure in the process chamber 201 becomes equal to a predetermined pressure (degree of vacuum). A pressure control unit 636 is electrically connected to the APC valve 231a and the pressure sensor 245. The pressure control unit 636 is configured to control the degree of opening the APC valve 231a based on pressure detected by the pressure sensor 245 such that pressure in the process chamber 201 becomes equal to a desired pressure at a desired timing. An exhaust unit (exhaust system) according to the present embodiment mainly includes the exhaust pipe 237, the pressure sensor 245 and the APC valve 231a. The vacuum pump 231c may be further included in the exhaust unit.

Substrate Retaining Mechanism

A seal cap 219 configured to block a lower end opening of the manifold 209 is formed to abut the manifold 209 from a lower side in a vertical direction. The seal cap 219 has a disk shape having an external diameter that is greater than or equal to the external diameter of the outer tube 203, and is configured to be vertically moved in a horizontal posture by a boat elevator 115 installed vertically outside the process tube 205.

On the seal cap 219, the boat 217 serving as a substrate retaining mechanism for retaining the wafers 200 vertically stands to be supported. The boat 217 includes a pair of upper and lower single boards 217c and a plurality of retainers 217a installed vertically between the upper and lower single boards 217c. The upper and lower single boards 217c and the plurality of retainers 217a are formed of a heat-resistant material, for example, quartz ($SiO_2$) or silicon carbide (SiC). In each of the plurality of retainers 217a, a plurality of retaining holes 217b are formed at equal intervals in a lengthwise direction. Circumferential edges of each the plurality of wafers 200 are inserted into the respective retaining holes 217b formed in the same stage of the plurality of retainers 217a such that the plurality of wafers 200 are stacked and retained in a multi-stage manner in a state in which they are disposed in a horizontal posture or concentrically.

Also, a pair of upper and lower auxiliary single boards 217d are installed between the boat 217 and the seal cap 219 while being supported by a plurality of auxiliary retainers 218. A plurality of retaining holes are formed in each of the auxiliary retainers 218. The plurality of retaining holes are configured such that, for example, a plurality of insulating boards 216 formed of a heat-resistant material such as quartz ($SiO_2$) or silicon carbide (SiC) and having a disc shape are loaded in a horizontal posture and a multi-stage manner. The plurality of insulating boards 216 are configured to prevent heat generated from a heater unit 207 which will be described below to be delivered to the manifold 209.

A rotation mechanism 254 configured to rotate the boat 217 is installed at a side of the seal cap 219 opposite to the process chamber 201. A rotary shaft 255 of the rotation mechanism 254 supports the boat 217 from a lower direction while passing through the seal cap 219. The rotation mechanism 254 is configured to rotate the wafers 200 in the process chamber 201 by rotating the rotary shaft 255. The seal cap 219 is configured to be vertically moved by the boat elevator 115 described above, and thereby the boat 217 may be loaded into and unloaded from the process chamber 201.

A driving control unit 237 is electrically connected to the rotation mechanism 254 and the boat elevator 115. The driving controller 237 is configured to control each of the rotation mechanism 254 and the boat elevator 115 to perform a desired operation at a desired timing.

Heater Unit

The heater unit 207 serving as a heating mechanism for heating the inside of the entire process tube 205 to have a uniform or predetermined temperature distribution is installed outside the outer tube 203 to surround the outer tube 203. The heater unit 207 is vertically installed by being supported by the housing of the substrate processing apparatus 101, and is configured as a resistance heating heater such as a carbon heater.

In the process tube 205, a temperature sensor 263 is installed as a temperature detector. A temperature control unit 238 is electrically connected to the heater unit 207 and the temperature sensor 263. The temperature control unit 238 is configured to control an amount of electric power to be supplied to the heater unit 207 based on temperature information detected by the temperature sensor 263 so that a temperature in the process chamber 201 have a desired temperature distribution at a desired timing.

A heating unit (heating system) according to the present embodiment mainly includes the heater unit 207 and the temperature sensor 263.

Gas Supply Unit

A channel-shaped spare chamber 201a is formed to externally protrude from sidewalls of the inner tube 204 (at locations 180 degrees from an exhaust hole 204a which will be described below) in a direction of a diameter of the inner tube 204, and to extend in a vertical direction. Sidewalls (not shown) of the spare chamber 201a form portions of the sidewalls of the inner tube 204. Also, inner walls of the spare chamber 201a form portions of inner walls of the process chamber 201. In the spare chamber 201a, nozzles 410, 420, 430, 440 and 450 configured to supply a gas into the process chamber 201 are installed along the inner walls of the spare chamber 201a (i.e., the inner walls of the process chamber 201) and in a direction in which the wafers 200 are stacked from a lower portion to an upper portion of the inner walls of the spare chamber 201a. That is, the nozzles 410, 420, 430, 440 and 450 are installed along a wafer arrangement region in which the wafers 200 are arranged in a region that horizontally surrounds the wafer arrangement region at a side of the wafer arrangement region. The nozzles 410, 420, 430, 440 and 450 are configured by L-shaped long nozzles, the horizontal portions of which are installed to pass through the manifold 209, and the vertical portions of which are installed vertically from at least one end side of the wafer arrangement region toward another end side thereof. Although FIG. 2 illustrates only one nozzle for convenience of explanation, the five nozzles 410, 420, 430, 440 and 450 are actually installed as illustrated in FIG. 3. A plurality of gas supply holes 410a, 420a, 430a, 440a and 450a configured to supply a gas (source gas) are formed at sides of the nozzles 410, 420, 430, 440 and 450, respectively. The gas supply holes 410a, 420a, 430a, 440a and 450a are formed having a level or inclined opening area from the bottom to the top in the same pitch.

End portions of the horizontal portions of the nozzles 410, 420, 430, 440 and 450 passing through the manifold 209 are connected to gas supply pipes 310, 320, 330, 340 and 350 serving as gas supply lines via gas introduction port units 410b, 420b, 430b, 440b and 450b, respectively, outside the process tube 205.

At the gas supply pipe 310, a mass flow controller (MFC) 312 serving as a flow rate control device (flow rate control member) and a valve 314 are sequentially installed starting from an upstream side thereof. For example, $N_2$ which is an inert gas is supplied into the process chamber 201 via the gas supply pipe 310. A first inert gas supply system mainly includes the nozzle 410, the gas supply pipe 310, the MFC 312 and the valve 314.

At the gas supply pipe 320, an MFC 322 serving as a flow rate control device (flow rate control member) and a valve 324 are sequentially installed starting from an upstream side thereof, and a first source gas including a first element, e.g., TMA gas [Al(CH$_3$)$_3$, tri-methyl aluminum] which is an aluminum (Al)-containing gas that contains aluminum (Al) as the first element, is supplied into the process chamber 201 via the gas supply pipe 320. Since the TMA gas is in a liquid state at normal temperature and normal pressure, the TMA gas in the liquid state is vaporized using a vaporizing system such as a vaporizer or a bubbler and is then supplied as the first source gas. A first source gas supply system mainly includes the nozzle 420, the gas supply pipe 320, the MFC 322 and the valve 324. The vaporizing system may further be included in the first source gas supply system. When, for example, the Al-containing gas described above is supplied from the gas supply pipe 320, an Al-containing gas supply system is configured of the first source gas supply system.

A downstream side of a carrier gas supply pipe configured to supply N$_2$ gas or the like which is an inert gas as a carrier gas is connected to a downstream side of the valve 324 at the gas supply pipe 320, and the N$_2$ gas or the like may be supplied into the process chamber 201 via the gas supply pipe 320.

At the gas supply pipe 330, an MFC 332, which is a flow rate control device (flow rate control member) and the valve 334 are sequentially installed starting from an upstream side thereof, and for example, an oxidizing gas such as ozone (O$_3$), i.e., an oxygen (O)-containing gas, is supplied as a reactive gas into the process chamber 201 via the gas supply pipe 330. The O$_3$ gas acts as an oxidized species. The O$_3$ gas is generated by an ozone generation device configured to generate O$_3$, i.e., an ozonizer serving as an ozone generator, and is supplied into the process chamber 201 via the gas supply pipe 330. An oxygen-containing gas supply system is configured as a reactive gas supply system mainly by the nozzle 430, the gas supply pipe 330, the MFC 332 and the valve 334. The ozonizer may further be included in the reactive gas supply system.

A downstream side of a carrier gas supply pipe configured to supply N$_2$ gas or the like which is an inert gas as a carrier gas is connected to a downstream side of the valve 344 of the gas supply pipe 330, and the N$_2$ gas or the like may be supplied into the process chamber 201 via the gas supply pipe 330.

At the gas supply pipe 340, an MFC 342, which is a flow rate control device (flow rate control member) and a valve 344 are sequentially installed starting from an upstream side thereof. A second source gas including a second element different from the first element, e.g., TDMAH gas [Hf(N(CH$_3$)$_2$)$_4$] which is a Hf-containing gas that contains hafnium (Hf) and is obtained by vaporizing a liquid source, is supplied as a third process gas into the process chamber 201 via the gas supply pipe 340. The TDMAH gas is in a liquid state at normal temperature and normal pressure, and the TDMAH gas in the liquid state is vaporized using the vaporizing system such as a vaporizer or a bubbler and then supplied as the second source gas. A second source gas supply system mainly includes the nozzle 440, the gas supply pipe 340, the MFC 342 and the valve 344. The vaporizing system may be further included in the second source gas supply system. When the Hf-containing gas described above is supplied from, for example, the gas supply pipe 340, a Hf-containing gas supply system is configured of the second source gas supply system.

A downstream side of a carrier gas supply pipe configured to supply N$_2$ gas or the like which is an inert gas as a carrier gas is connected to a downstream side of the valve 344 of the gas supply pipe 340, and the N$_2$ gas or the like may be supplied into the process chamber 201 via the gas supply pipe 340.

At the gas supply pipe 350, an MFC 352 (mass flow controller), which is a flow rate control device (flow rate control member) and a valve 354 are sequentially installed starting from an upstream side thereof, and for example, N$_2$ or the like which is an inert gas is supplied into the process chamber 201 via the gas supply pipe 350. A second inert gas supply system mainly includes the nozzle 450, the gas supply pipe 350, the MFC 352 and the valve 354.

A gas supply & flow rate control unit 635 is electrically connected to the MFCs 312, 322, 332, 342 and 352 and the valves 314, 324, 334, 344 and 354. The gas supply & flow rate control unit 635 is configured to control the MFCs 312, 322, 332, 342 and 352 and the valves 314, 324, 334, 344 and 354 so that in each step to be described below, a desired type of a gas may be supplied into the process chamber 201 at a desired timing, a desired flow rate of a gas may be supplied into the process 201 at a desired timing, and a gas supplied into the process chamber may have a desired concentration with respect to an inert gas at a desired timing.

As described above, in a gas supply method according to the present embodiment, a gas is transferred via the nozzles 410, 420, 430, 440 and 450 disposed in the spare chamber 201a and is then first emitted into the inner tube 204 near the wafers 200 from the gas supply holes 410a, 420a, 430a, 440a and 450a that are open in the respective nozzles 410, 420, 430, 440 and 450.

At a location that faces the nozzles 410, 420, 430, 440 and 450 (a location that is 180° from the spare chamber 201a), i.e., a sidewall of the inner tube 204, for example, the exhaust hole 204a which is a slit-type through-hole is installed to be slender and long in the vertical direction. The insides of the process chamber 201 and the exhaust passage communicate with each other via the exhaust hole 204a. Thus, a gas supplied into the process chamber 201 via the gas supply holes 410a, 420a, 430a, 440a and 450a formed in the respective nozzles 410, 420, 430, 440 and 450 flows into the exhaust passage via the exhaust hole 204a, flows into the exhaust pipe 237 via the exhaust mechanism, and is then discharged from the process furnace 202. However, the exhaust hole 204a is not limited to the slit-type through-hole and may be configured of a plurality of holes. In particular, a gas supplied near the wafers 200 in the process chamber 201 from the gas supply holes 420a, 430a and 440a flows in the horizontal direction, i.e., a direction parallel with surfaces of the wafers 200, and then flows into the exhaust passage via the exhaust hole 204a.

Controller

Figure 4:
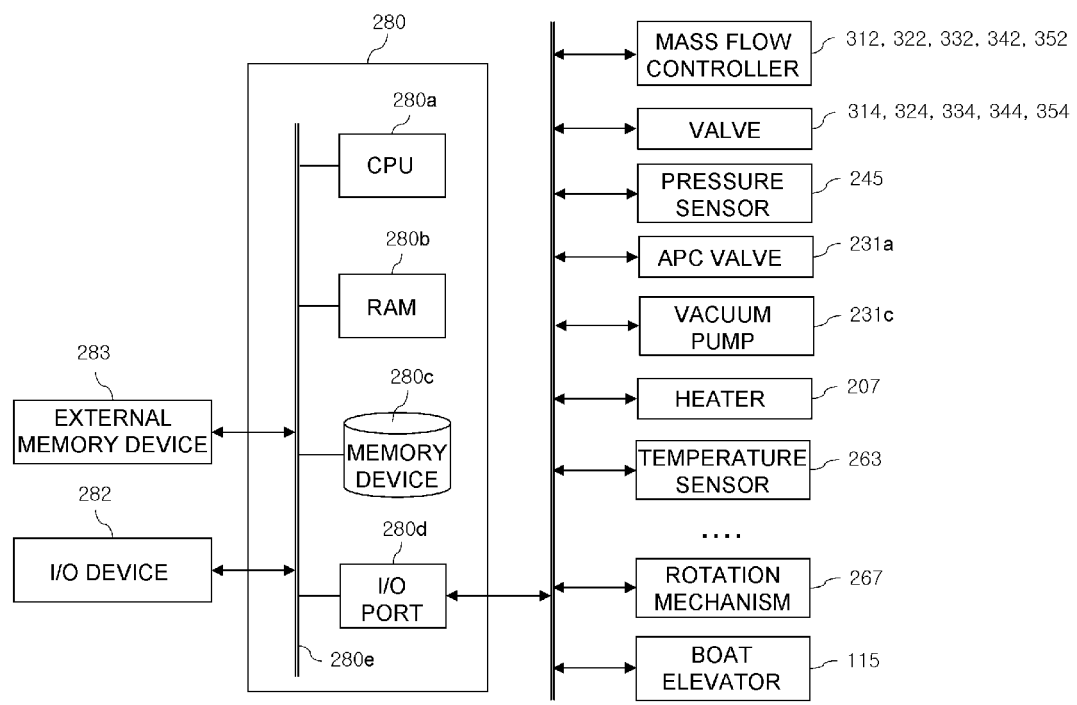
FIG. 4 is a block diagram of a controller that is preferably used in a substrate processing apparatus and members controlled by the controller according to an exemplary embodiment of the present invention.

As illustrated in FIG. 4, a controller 280 which is a control unit (control member) is configured as a computer that includes a central processing unit (CPU) 280a, a random access memory (RAM) 280b, a memory device 280c and an input/output (I/O) port 280d. The RAM 280b, the memory device 280c and the I/O port 280d are configured to exchange data with the CPU 280a via an internal bus 280e. An I/O device 282 embodied as, for example, a touch panel, etc., is connected to the controller 280.

The memory device 280c is embodied as, for example, a flash memory, a hard disk drive (HDD), etc. In the memory device 280c, a control program that controls an operation of a substrate processing apparatus or a process recipe instructing an order or conditions of processing a substrate (which will be described below) are stored to be readable. The process recipe is obtained by combining operations of a substrate processing process (which will be described below) such that a desired result is obtained when the operations are performed by the controller 280, and acts as a program. Hereinafter, such a process recipe and a control program will be referred to collectively simply as a 'program.' Also, when the term 'program' is used in the present disclosure, it can be understood as including only a program recipe, only a control program, or both the program recipe and the control program. The RAM 280*b* is configured as a memory area (work area) for temporarily storing a program or data read by the CPU 280*a*.

The I/O port 280*d* is connected to the MFCs 312, 322, 332, 342 and 352, the valves 314, 324, 334, 344 and 354, the pressure sensor 245, the APC valve 231*a*, the vacuum pump 231*c*, the heater unit 207, the temperature sensor 263, the rotation mechanism 254, the boat elevator 115, etc. which are described above.

The CPU 280*a* is configured to read and execute the control program stored in the memory device 280*c*, and read the process recipe from the memory device 280*c* according to a manipulation command received via the I/O device 282. Also, according to the read process recipe, the CPU 280*a* is configured to control the MFCs 312, 322, 332, 342 and 352 to adjust the flow rates of various gases, control the valves 314, 324, 334, 344 and 354 to be opened/closed, control the APC valve 231*a* to be opened/closed and to adjust pressure based on the pressure sensor 245, control the heater unit 207 to adjust temperature based on the temperature sensor 263, control the vacuum pump 231*c* to be started and stopped, control the rotation mechanism 254 to rotate the boat 217 and adjust a rotation speed of the boat 217, and control the boat elevator 115 to move the boat 217 upward/downward.

The controller 280 is not limited to a dedicated computer but may be configured as a general-purpose computer. For example, the controller 280 according to the present embodiment may be configured by preparing, for example, an external memory device 283 storing such programs, e.g., a magnetic disk (a magnetic tape, a flexible disk, a hard disk, etc.), an optical disc (a Compact Disc (CD), a Digital Versatile Disc (DVD), etc.), a magneto-optical disc (MO), or a semiconductor memory (a Universal Serial Bus (USB) memory, a memory card, etc.), and then installing the programs in a general-purpose computer using the external storage device 283. However, a method of supplying a program to a computer is not limited to using the external memory device 283. For example, a communication unit, such as the Internet or an exclusive line, may be used to supply a program to a computer without using the external memory device 283. The memory device 280*c* or the external memory device 283 may be configured as a non-transitory computer-readable recording medium. Hereinafter, the memory device 280*c* and the external memory device 283 may also be referred to collectively as simply a 'recording medium.' When the term 'recording medium' is used in the present disclosure, it may be understood as including only the memory device 280*c*, only the external memory device 283, or both the memory device 280*c* and the external memory device 283.

Next, an example of a process of manufacturing a semiconductor device for manufacturing a large-scale integrated circuit (LSI) using the substrate processing apparatus described above will be described. In the following description, operations of elements of a substrate processing apparatus are controlled by the controller 280. Here, an insulating film containing a first element is formed on the wafers 200 serving as substrates, and a second element different from the first element is doped into the insulating film. Hereinafter, a case in which Hf is doped into an $Al_2O_3$ film (aluminum oxide film) which is an oxide film serving as an insulating film (which is used particularly as a charge-trap type flash memory which is an example of a semiconductor device), i.e., an insulating film applied as a blocking insulating film, will be described.

Here, a case in which a Hf-doped $Al_2O_3$ film (AlHfO film, a hafnium-doped aluminum oxide film) is formed on the wafers 200 serving as substrates (i.e., on surfaces of the wafers 200, on underlying films formed on the surfaces of the wafers 200, etc.) using Al as a first element, using Hf as a second element, using TMA gas which is an Al-containing gas as a first source gas including the first element, using TDMAH gas which is a Hf-containing gas as a second source gas including the second element, and using $O_3$ gas as an O-containing gas will be described below.

Figure 5:
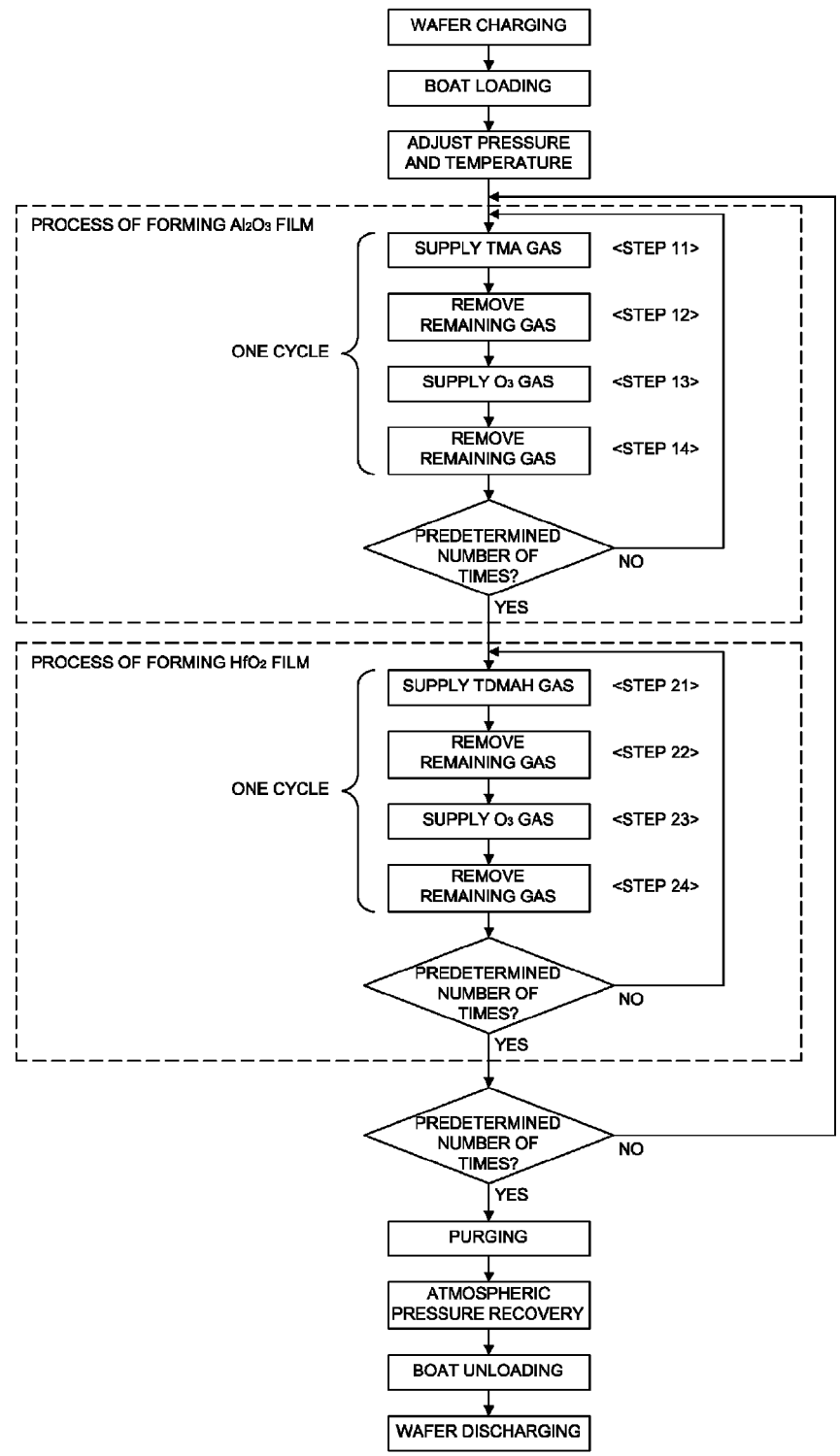
FIG. 5 is a flowchart illustrating the flow of a film-forming process according to an exemplary embodiment of the present invention.
Figure 6:
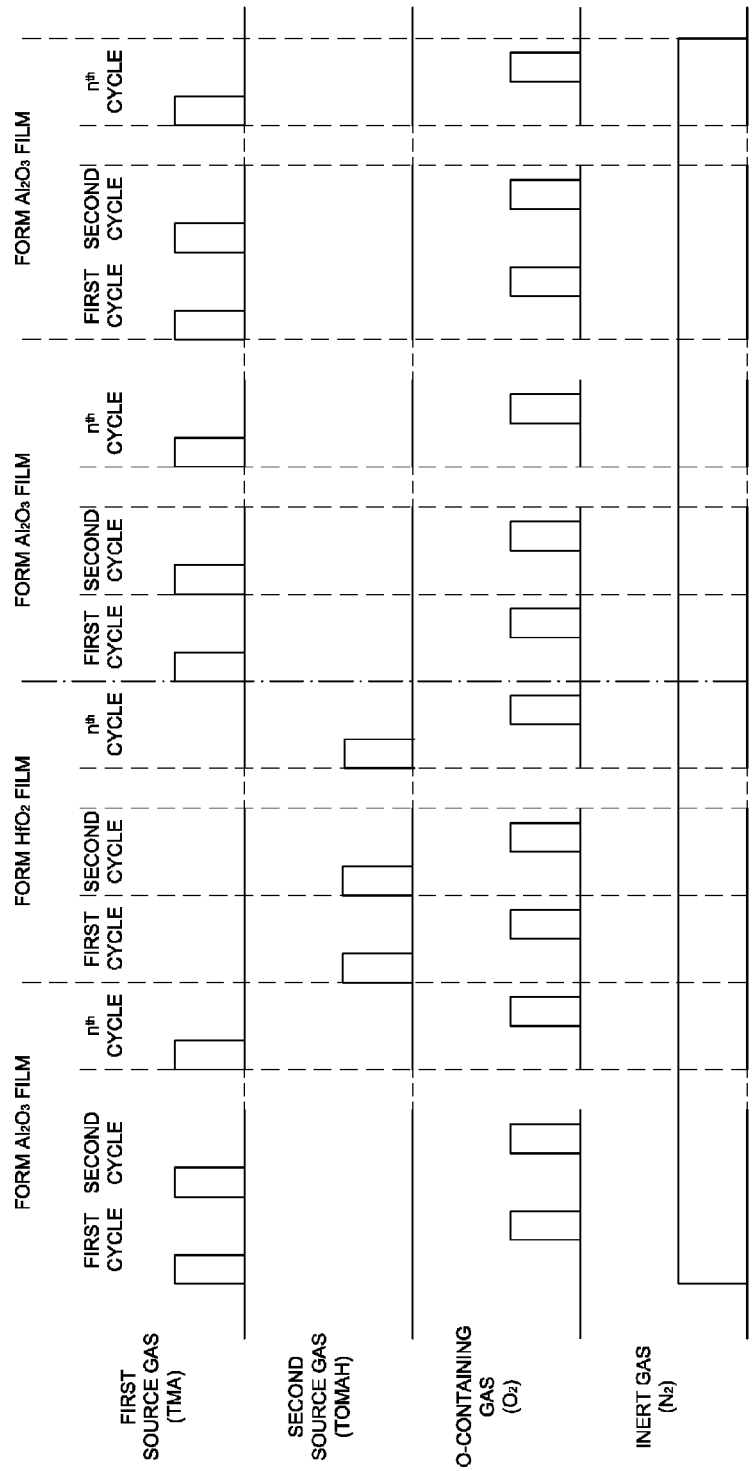
FIG. 6 is a timing chart illustrating gas supply timing in a film-forming sequence according to an exemplary embodiment of the present invention.

A film-forming sequence will be described in detail with reference to FIGS. 5 and 6 below. FIG. 5 is a flowchart illustrating a flow of a film-forming process and FIG. 6 is a timing chart illustrating gas supply timing in the film-forming sequence. Here, a case in which (1) forming an $Al_2O_3$ film (first oxide film) on the wafers 200 to a desired thickness by performing, a predetermined number of times (n times), one cycle including forming an Al-containing film on the wafers 200 by supplying TMA gas (which is an Al-containing gas) as a first source gas that contains Al as a first element on the wafers 200 heated in the process chamber 201, exhausting the TMA gas remaining in the process chamber 201 via an exhaust line while the supply of the TMA gas is suspended, forming an $Al_2O_3$ layer by supplying $O_3$ gas (which is an oxidizing gas) as a reactive gas different from the first source gas onto the wafers 200 heated in the process chamber 201 and causing the $O_3$ gas to react with the Al-containing layer, and exhausting the $O_3$ gas remaining in the process chamber 201 via the exhaust line is performed; (2) forming a $HfO_2$ film on the wafers 200 to a desired thickness by performing, a predetermined number of times (n times), one cycle including forming a Hf-containing layer on the wafers 200 heated in the process chamber 201 by supplying TDMAH gas (which is a Hf-containing gas) as a second source gas containing Hf as a second element, exhausting the TDMAH gas remaining in the process chamber 201 via the exhaust line while the supply of the TDMAH gas is suspended, forming a $HfO_2$ layer by supplying $O_3$ gas onto the wafers 200 heated in the process chamber 201 and causing the $O_3$ gas to react with the Hf-containing layer, and exhausting the $O_3$ gas remaining in the process chamber 201 via the exhaust line is performed; and a Hf-doped $Al_2O_3$ film (second oxide film) in which a predetermined concentration of Hf is doped into the $Al_2O_3$ film is formed by performing the processes (1) and (2) a predetermined number of times, will be described below.

Wafer Charging and Boat Loading

Figure 2:
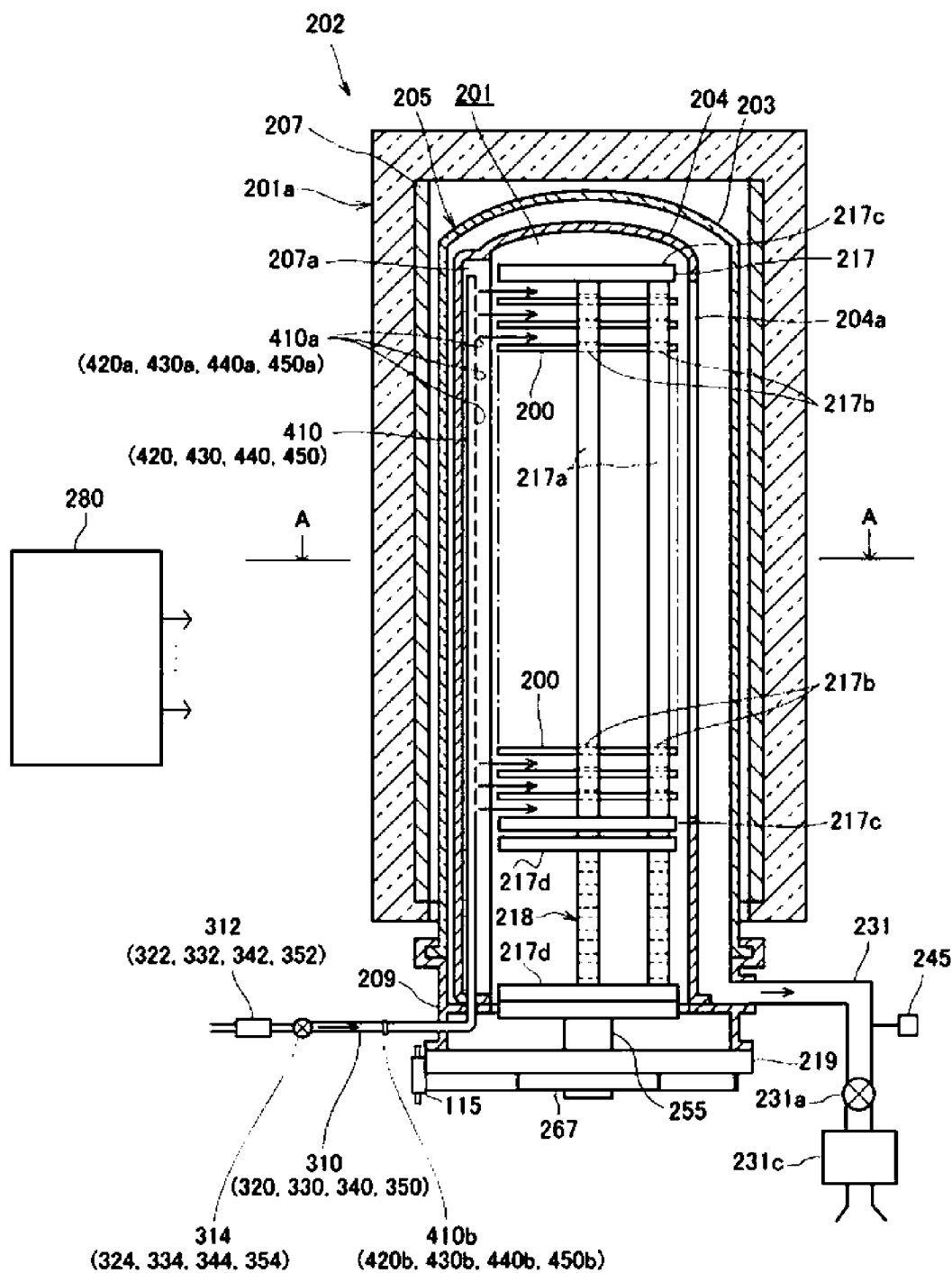
FIG. 2 is a schematic configuration diagram of a process furnace and members included therein according to an exemplary embodiment of the present invention, in which a longitudinal cross-sectional view of a portion of the process furnace is illustrated.
Figure 3:
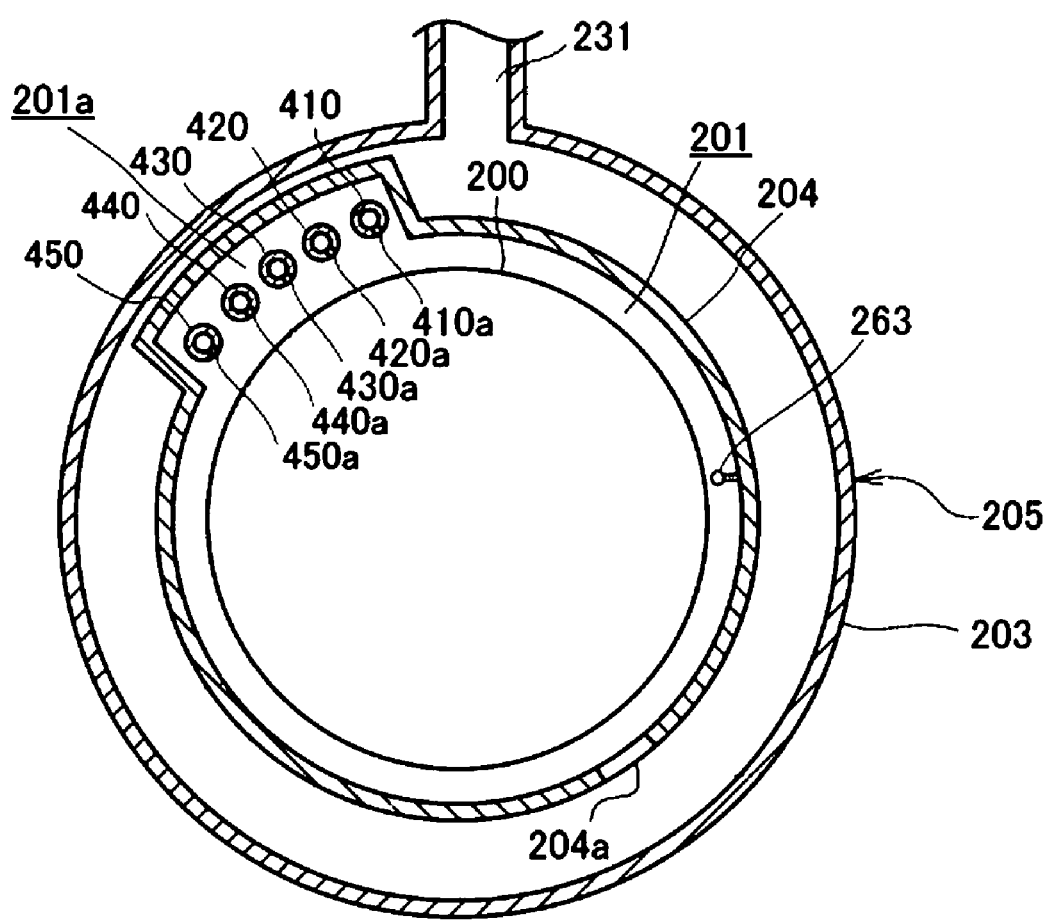
FIG. 3 is a schematic cross-sectional view of the process furnace, taken along line A-A of FIG. 2.

When a plurality of wafers 200 are loaded on the boat 217 (wafer charging), the boat 217 supporting the plurality of wafers 200 is lifted by the boat elevator 115 and is then loaded into the process chamber 201 (boat loading) as illustrated in FIG. 2. In this state, a lower end of the reaction tube 203 is sealed by the seal cap 219 via an O-ring 220.

Pressure & Temperature Adjustment

The inside of the process chamber 201 is vacuum-exhausted to a desired pressure (degree of vacuum) by the vacuum pump 231*c*. In this case, the pressure in the process chamber 201 is measured by the pressure sensor 245 and the APC valve 231*a* is feedback-controlled based on the measured pressure (pressure adjustment). Also, the vacuum pump 231*c* is continuously operated at least until processing of the wafers 200 is completed. Also, the inside of the process chamber 201 is heated to a desired temperature by the heater unit 207. In this case, the state of supplying electric power to the heater unit 207 is feedback-controlled based on temperature information detected by the temperature sensor 263 so that the inside of the process chamber 201 may have a desired temperature distribution (temperature adjustment). The inside of the process chamber 201 is continuously heated by the heater unit 207 at least until processing of the wafers 200 is completed. Then, the rotation mechanism 254 starts to rotate the boat 217 and the wafer 200 rotation mechanism 254. The boat 217 and the wafer 200 are continuously rotated by the rotation mechanism 254 at least until processing of the wafers 200 is completed.

Process of Forming an $Al_2O_3$ Film

Then, the following four steps, i.e., steps 11 to 14, are sequentially performed.

Step 11: Supply of TMA Gas

The valve 324 of the gas supply pipe 320 is opened to supply TMA gas as the first source gas into the gas supply pipe 320. The flow rate of the TMA gas flowing into the gas supply pipe 320 is controlled by the MFC 322. The flow-rate controlled TMA gas is supplied into the process chamber 201 from the gas supply hole 420a of the nozzle 420, and is then exhausted via the exhaust pipe 231. In this case, the TMA gas is supplied onto the wafers 200. At the same time, $N_2$ gas is supplied via the carrier gas supply pipe connected to the gas supply pipe 320. The $N_2$ gas is supplied into the process chamber 201 together with the TMA gas, and is exhausted via the exhaust pipe 231. In this case, in order to prevent the TMA gas from being supplied into the nozzles 410, 430, 440 and 450, the valves 314 and 354 are opened to supply $N_2$ gas into the gas supply pipes 310 and 350, and at the same time, the valves 334 and 344 are opened to supply the $N_2$ gas via the carrier gas supply pipe connected to the gas supply pipes 330 and 340. The $N_2$ gas is supplied into the process chamber 201 via the gas supply pipes 310, 330, 340 and 350 and the nozzles 410, 430, 440 and 450, and is exhausted via the exhaust pipe 231.

In this case, the APC valve 231a is appropriately controlled to set the pressure in the process chamber 201 to fall within, for example, a range of 1 to 13,300 Pa (preferably, a range of 30 to 500 Pa), for example, 50 Pa. The supply flow rate of the TMA gas controlled by the MFC 322 is set to fall within, for example, a range of 10 to 200 sccm, and preferably 50 sccm. The supply flow rate of $N_2$ gas as a carrier gas is set to, for example, 1 slm. A duration for which the TMA gas is supplied onto the wafers 200, i.e., a gas supply duration (application time), is set to fall within, for example, a range of 1 to 20 seconds, and preferably 10 seconds. In this case, a temperature of the heater unit 207 is set such that the temperature of the wafers 200 falls within, for example, a range of 150 to 250° C., and preferably 250° C. By supplying the TMA gas, an Al-containing layer is formed on the wafers 200 (or on underlying films on the wafers 200).

Step 12: Removal of Remaining Gas

After the Al-containing layer is formed on the wafers 200, the valve 324 of the gas supply pipe 320 is closed and the supply of the TMA gas is suspended. In this case, the inside of the process chamber 201 is vacuum-exhausted by the vacuum pump 231c while the APC valve 231a of the exhaust pipe 231 is open, thereby eliminating the TMA gas (that does not react or that contributes to the formation of the Al-containing film) remaining in the process chamber 201 from the process chamber 201. In this case, the $N_2$ gas is continuously supplied into process chamber 201 via the nozzles 410, 420, 430, 440 and 450. The $N_2$ gas acts as a purge gas to increase the effect of eliminating the TMA gas (that does not react or that contributes when the Al-containing film is formed) remaining in the process chamber 201 from the process chamber 201. Also, in this case, the gas remaining in the process chamber 201 may not be completely eliminated and the inside of the process chamber 201 may not be completely purged. When a small amount of gas remains in the process chamber 201, step 13 to be performed thereafter is not badly influenced by the gas. In this case, the flow rate of the $N_2$ gas to be supplied into the process chamber 201 need not be high. For example, the inside of the process chamber 201 may be purged without causing step 13 to be badly influenced by the gas by supplying an amount of gas corresponding to the capacity of the reaction tube 203 (process chamber 201). As described above, when the inside of the process chamber 201 is not completely purged, a purge time may be reduced and the throughput may be improved. Furthermore, the consumption of the $N_2$ gas may be suppressed to a necessary minimum level.

Step 13: Supply of $O_3$ Gas

The valve 334 of the gas supply pipe 330 is opened and an O-containing gas is supplied as a reactive gas, e.g., $O_3$ gas, into the gas supply pipe 330. The flow rate of the $O_3$ gas flowing into the gas supply pipe 330 is controlled by the MFC 332. The flow-rate controlled $O_3$ gas is supplied into the process chamber 201 from the gas supply hole 430a of the nozzle 430, and is exhausted via the exhaust pipe 231. In this case, the $O_3$ gas is supplied onto the wafers 200. In this case, in order to prevent the $O_3$ gas from being supplied into the nozzles 410, 420, 440 and 450, $N_2$ gas is supplied into the gas supply pipes 310 and 350 by opening the valves 314 and 354, and at the same time, the $N_2$ gas is supplied via the carrier gas supply pipe connected to the gas supply pipes 320 and 340 by opening the valves 324 and 344. The $N_2$ gas is supplied into the process chamber 201 via the gas supply pipes 310, 320, 340 and 350 and the nozzles 410, 420, 440 and 450 and is then exhausted via the exhaust pipe 231.

In this case, the APC valve 231a is appropriately adjusted to set the pressure in the process chamber 201 to fall within a range of 1 to 13,300 Pa (preferably, a range of 30 to 500 Pa), for example, 130 Pa. The supply flow rate of $O_3$ gas controlled by the MFC 332 is set to fall within, for example, a range of 9 to 20 slm, and preferably 15 slm. A duration for which the $O_3$ gas is supplied onto the wafers 200, i.e., a gas supply time (illumination time), is set to fall within, for example, a range of 10 to 30 seconds, and preferably 20 seconds. In this case, a temperature of the heater unit 207 is set such that the temperature of the wafers 200 falls within, for example, a range of 150 to 250° C., and is preferably 250° C. When the $O_3$ gas is supplied, the $O_3$ gas reacts with the Al-containing layer formed on the wafers 200 (or on underlying films on the wafers 200) to form an $Al_2O_3$ layer on the wafers 200.

Step 14: Removal of Remaining Gas

After the $Al_2O_3$ layer is formed on the wafers 200, the valve 334 of the gas supply pipe 330 is closed and the supply of the $O_3$ gas is suspended. In this case, while the APC valve 231a of the exhaust pipe 231 is open, the inside of the process chamber 201 is vacuum-exhausted by the vacuum pump 231c to eliminate the $O_3$ gas (that does not react or contributes to the formation of the $Al_2O_3$ layer) remaining in the process chamber 201 from the inside of the process chamber 201. Also, in this case, the $N_2$ gas is continuously supplied into the process chamber 201 via the nozzles 410, 420, 440 and 450. Also, $N_2$ gas is supplied into the process chamber 201 through the carrier gas supply pipe connected to the gas supply pipe 330 via the gas supply pipe 330 and the nozzle 430. The $N_2$ gas may act as a purge gas to increase the effect of eliminating the $O_3$ gas (that does not react or contributes to the formation of the $Al_2O_3$ layer) remaining in the process chamber 201 from the process chamber 201. In this case, the gas remaining in the process chamber 201 may not be completely eliminated and the inside of the process chamber 201 may not be completely purged. When a small amount of the gas remains in the process chamber 201, step 11 to be performed thereafter is not badly influenced by the gas. In this case, the flow rate of $N_2$ gas to be supplied into the process chamber 201 need not be high. For example, the inside of the process chamber 201 may be purged without causing step 11 to be badly influenced by supplying an amount of gas corresponding to the capacity of the reaction tube 203 (process chamber 201). As described above, when the inside of the process chamber 201 is not completely purged, a purge time may be reduced and the throughput may be improved. Also, the consumption of the $N_2$ gas may be suppressed to a necessary minimum level.

The $Al_2O_3$ film (aluminum oxide film) may be formed to a desired thickness on the wafers 200 by performing a cycle including steps 11 to 14 described above at least once (or a predetermined number of times). This cycle is preferably performed a plurality of times. In other words, it is preferable that the thickness of the $Al_2O_3$ layer that is to be formed per cycle be set to be thinner than the desired thickness and the cycle described above be performed repeatedly the plurality of times until the desired thickness is achieved.

$HFO_2$ Film Forming Process

Thereafter, the following four steps, i.e., steps 21 to 24, are sequentially performed.

Step 21: Supply of TDMAH Gas

The valve 344 of the gas supply pipe 340 is opened, and TDMAH gas is supplied as a second source gas into the gas supply pipe 340. The flow rate of the TDMAH gas flowing into the gas supply pipe 340 is controlled by the MFC 342. The flow-rate controlled TDMAH gas is supplied into the process chamber 201 from the gas supply hole 440a of the nozzle 440, and is exhausted via the exhaust pipe 231. In this case, the TDMAH gas is supplied onto the wafers 200. At the same time, $N_2$ gas is supplied via the carrier gas supply pipe connected to the gas supply pipe 340. The $N_2$ gas is supplied into the process chamber 201 together with the TDMAH gas, and is exhausted via the exhaust pipe 231. In this case, in order to prevent the TDMAH gas from being supplied into the nozzles 410, 420, 430 and 450, the $N_2$ gas is supplied into the gas supply pipes 310 and 350 by opening the valves 314 and 354 and the valves 324 and 334, and the $N_2$ gas is supplied through the carrier gas supply pipe connected to the gas supply pipes 320 and 330. The $N_2$ gas is supplied into the process chamber 201 via the gas supply pipes 310, 320, 330 and 350 and the nozzles 410, 420, 430 and 450, and is exhausted via the exhaust pipe 231.

The TDMAH gas greatly influences uniformity in wafer planes when substrate processing is performed (i.e., thickness uniformity of a $HfO_2$ film formed on the surfaces of the wafers 200 in planes). Thus, in step 21, while the TDMAH gas is supplied into the process chamber 201, the valves 314 and 354 of the respective gas supply pipes 310 and 350 may be opened to supply $N_2$ gas which is an inert gas to the supply pipes 310 and 350. The flow rate of the $N_2$ gas flowing into the gas supply pipes 310 and 350 is controlled by the MFCs 312 and 352. The flow-rate controlled $N_2$ gas is supplied into the process chamber 201 from the gas supply holes 410a and 450a of the nozzles 410 and 450, and is exhausted via the exhaust pipe 231. Thus, since the flow of the TDMAH gas supplied into the process chamber 201 from the gas supply hole 440a of the nozzle 440 is interposed between both sides of the $N_2$ gas supplied into the process chamber 201 from the gas supply holes 410a and 450a of the nozzles 410 and 450, a flow channel of the TDMAH gas is limited. For example, when the $N_2$ gas is supplied into gaps between circumferential portions of the wafers 200 and the process chamber 201, the pressure in such a region is relatively increased and the TDMAH gas is thus suppressed from flowing (leaking) into the gaps between circumferential portions the wafers 200 and the process chamber 201. As a result, the supply of the TDMAH gas into the vicinity of central portions of the wafers 200 is accelerated and the supply rate of the TDMAH gas is more unified near the circumferential and central portions of the wafers 200. Also, the TDMAH gas is diluted with the $N_2$ gas in the gaps between the circumferential portions of the wafers 200 and the process chamber 201, thereby preventing a film from being formed excessively thickly near the circumferential portions of the wafer 200. As described above, in step 21, the $N_2$ gas supplied from the gas supply pipes 310 and 350 functions as an assist gas to limit the flow channel of a process gas and uniformize the supply rate of the process gas onto the wafers 200.

Also, the $N_2$ gas is preferably supplied from the nozzles 410 and 450 at a flow rate that is greater than or equal to the flow rate of the TDMAH gas supplied from the nozzle 440 when the TDMAH gas is supplied from the nozzle 440. That is, the flow rates of the $N_2$ gas supplied from the respective gas supply holes 410a and 450a of the nozzles 410 and 450 are preferably greater than or equal to the flow rates of the TDMAH gas supplied from the gas supply hole 440a of the nozzle 440. The flow rate of the TDMAH gas and the flow rate of the $N_2$ gas are controlled by the MFCs 312, 342 and 352. Thus, the supply of the TDMAH gas to the vicinity of the central portions of the wafers 200 is accelerated more. Furthermore, the TDMAH gas is diluted more with the $N_2$ gas in the gaps between the circumferential portions of the wafers 200 and the process chamber 201.

In step 21, the pressure in the process chamber 201 is controlled to fall within a range of 30 to 500 Pa, e.g., 50 Pa. Also, the supply flow rate of the TDMAH gas via the nozzle 440 is controlled to fall within a range of 20 to 1,000 sccm, e.g., to fall within a range of 200 to 300 sccm. The supply flow rate of the $N_2$ gas (serving as a carrier gas) into the carrier gas supply pipe connected to the gas supply pipe 440 is controlled to be, for example, 1.0 slm. The supply flow rates of the $N_2$ gas (serving as an assist gas) via the respective nozzles 410 and 450 are controlled to fall within a range of 20 to 30 slm, e.g., to be 30 slm. The temperature in the process chamber 201 is controlled to fall within a range of 180 to 250° C., e.g., to be 250° C. A duration for which the wafers 200 are exposed to the TDMAH gas (an execution time in step 21) is set to fall within a range of 30 to 180 seconds, e.g., 120 seconds. A Hf-containing layer is formed on the wafers 200 (or underlying films on the surfaces of the wafers 200) by supplying the TDMAH gas thereto.

Step 22: Removal of Remaining Gas

After the Hf-containing layer is formed on the wafers 200, the valve 344 of the gas supply pipe 340 is closed and the supply of the TMA gas is suspended. In this case, the inside of the process chamber 210 is vacuum-exhausted by the vacuum pump 231c while the APC valve 231a of the exhaust pipe 231 is open in order to eliminate the TDMAH gas (that does not react or contributes to the formation of the Hf-containing layer) remaining in the process chamber 201 from the process chamber 201. In this case, the $N_2$ gas is continuously supplied into the process chamber 201 via the nozzles 410, 420, 420, 430 and 450. The supply flow rate of the $N_2$ gas via the nozzles 410 and 450 is preferably appropriately reduced to a minimum supply flow rate. The $N_2$ gas acts as a purge gas to increase the effect of eliminating the remaining TDMAH gas (that does not react or contributes to the formation of the Hf-containing layer) from the process chamber 201. In this case, the gas remaining in the process chamber 201 may not be completely eliminated, and the inside of the process chamber 201 may not be completely purged. When a small amount of gas remains in the process chamber 201, step 23 to be performed thereafter is not badly influenced by the gas. In this case, the supply flow rate of the $N_2$ gas into the process chamber 201 need not be high. For example, when the amount of the $N_2$ gas corresponding to the capacity of the reaction tube 203 (process chamber 201) is supplied, the inside of the process chamber 201 may be purged without causing step 23 to be badly influenced by the gas. As described above, when the inside of the process chamber 201 is not completely purged, a purge time may be reduced and the throughput may be improved. Also, the consumption of the $N_2$ gas may be suppressed to a necessary minimum level.

Step 23: Supply of $O_3$ Gas

The valve 334 of the gas supply pipe 330 is opened, and an O-containing gas is supplied as a reactive gas, e.g., $O_3$ gas, into the gas supply pipe 330. The flow rate of the $O_3$ gas flowing into the gas supply pipe 330 is controlled by the MFC 332. The flow-rate controlled $O_3$ gas is supplied into the process chamber 201 from the gas supply hole 430a of the nozzle 430, and is exhausted via the exhaust pipe 231. In this case, the $O_3$ gas is supplied onto the wafers 200. In this case, in order to prevent the $O_3$ gas from being supplied into the nozzles 410, 420, 440 and 450, the valves 314 and 354 are opened to supply the $N_2$ gas into the gas supply pipes 310 and 350, and at the same time, the valves 324 and 344 are opened to supply the $N_2$ gas through the carrier gas supply pipe connected to the gas supply pipes 320 and 340. The $N_2$ gas is supplied into the process chamber 201 via the gas supply pipes 310, 320, 340 and 350 and the nozzles 410, 420, 440 and 450, and is exhausted via the exhaust pipe 231.

In this case, the APC valve 231a is appropriately controlled to set the pressure in the process chamber 201 to fall within, for example, a range of 1 to 13,300 Pa (preferably, a range of 30 to 500 Pa), e.g., 130 Pa. The supply flow rate of the $O_3$ gas controlled by the MFC 332 is set to fall within, for example, a range of 9 to 20 slm, and preferably 15 slm. A duration for which the $O_3$ gas is supplied onto the wafers 200, i.e., a gas supply time (illumination time), is set to fall within, for example, a range of 50 to 150 seconds, and preferably 120 seconds. In this case, the temperature of the heater unit 207 is set such that the temperature of the wafers 200 falls within, for example, a range of 150 to 250° C., and is preferably set to 250° C. When the $O_3$ gas is supplied, the $O_3$ gas reacts with the Hf-containing layer formed on the wafers 200 (or underlying films on surfaces of the wafers 200) to form a $HfO_2$ layer on the wafers 200.

Step 24: Removal of Remaining Gas

When the $HfO_2$ layer is formed on the wafers 200, the valve 344 of the gas supply pipe 340 is closed and the supply of the $O_3$ gas is suspended. In this case, the inside of the process chamber 201 is vacuum-exhausted by the vacuum pump 231c while the APC valve 231a of the exhaust pipe 231 is open to eliminate the $O_3$ gas (that does not react or contributes to the formation of the $HfO_2$ layer) remaining in the process chamber 201 from the process chamber 201. In this case, the $N_2$ gas is continuously supplied into the process chamber 201 via the nozzles 410, 420, 440 and 450. Also, the $N_2$ gas is supplied into the process chamber 201 through the carrier gas supply pipe connected to the gas supply pipe 330 via the gas supply pipe 330 and the nozzle 430. The $N_2$ gas acts as a purge gas to increase the effect of eliminating the remaining $O_3$ gas (that does not react or contributes to the formation of the $HfO_2$ layer) from the process chamber 201. Also, in this case, the gas remaining in the process chamber 201 may not be completely eliminated and the inside of the process chamber 201 may not be completely purged. When a small amount of the gas remains in the process chamber 201, neither of step 21 and step 11 is badly influenced by the gas. In this case, the flow rate of the $N_2$ gas to be supplied into the process chamber 201 need not be high. For example, when an amount of the gas corresponding to the capacity of the reaction tube 203 (process chamber 201) is supplied, the inside of the process chamber 201 may be purged without causing step 21 or step 11 to be badly influenced by the gas. As described above, when the inside of the process chamber 201 is not completely purged, a purge time may be reduced and the throughput may be improved. Also, the consumption of the $N_2$ gas may be suppressed to a necessary minimum level.

The $HfO_2$ film (hafnium oxide film) may be formed on the wafers 200 to a desired thickness by performing one cycle including steps 21 to 24 described above at least once (or a predetermined number of times or m times). This cycle is preferably performed a plurality of times. That is, it is preferable that the thickness of the $HfO_2$ layer that is to be formed per cycle be set to be thinner than the desired thickness and the cycle described above be performed repeatedly the plurality of times until the desired thickness is achieved.

An $Al_2O_3$ layer is formed on the wafers 200 by performing the process of forming an $Al_2O_3$ film described above in steps 11 to 14, and a $HfO_2$ film is added (doped) into the $Al_2O_3$ film by performing the process of forming a $HfO_2$ film described above in steps 21 to 24 whenever the $Al_2O_3$ film having a predetermined thickness is formed, thereby forming an AlHfO film (or Hf-doped $Al_2O_3$ film or hafnium oxide film-doped aluminum oxide film) on the wafers 200. Preferably, the amount of Hf doped into the Hf-doped $Al_2O_3$ film is lower than the concentration of Al in the Hf-doped $Al_2O_3$ film. For example, the concentration of Hf in the Hf-doped $Al_2O_3$ film is controlled such that the amount of doped Hf is equal to or lower than 40%. More preferably, the amount of doped Hf is about 2 to 38%. For example, the concentration of Hf in the Hf-doped $Al_2O_3$ film is controlled such that the amount of doped Hf is 12%. Preferably, the process of forming a $HfO_2$ film is performed m times whenever the process of forming an $Al_2O_3$ film is performed n times, wherein n>m>1.

Purging and Atmospheric Pressure Recovery

After the AlHfO film is formed to the desired thickness, the valves 314 and 354 of the gas supply pipes 310 and 350 are opened, and $N_2$ gas is supplied into the process chamber 201 from the gas supply holes 410a and 450a of the nozzles 410 and 450 and is then exhausted via the exhaust pipe 231. At the same time, $N_2$ gas is supplied into the gas supply pipes 320, 330 and 340, is supplied into the process chamber 201 from the gas supply holes 420a, 430a and 440a of the nozzles 420, 430 and 440 through the carrier gas supply pipe connected to the gas supply pipes 320, 330 and 340, and is then exhausted via the exhaust pipe 231. The $N_2$ gas acts as a purge gas, and thus the inside of the process chamber 201 is purged with an inert gas, thereby eliminating a gas or by-products remaining in the process chamber 201 from the process chamber 201 (purging). Thereafter, an atmosphere in the process chamber 201 is replaced with the inert gas (inert gas replacement), and the pressure in the process chamber 201 is recovered to normal pressure (atmospheric pressure recovery).

Boat Unloading and Wafer Discharging

Then, the seal cap 219 is moved downward by the boat elevator 115 to open the lower end of the reaction tube 203, and the processed wafers 200 are unloaded from the reaction tube 203 from the lower end of the reaction tube 203 (boat unloading) while being supported by the boat 217. Then, the processed wafers 200 are unloaded from the boat 217 (wafer discharging).

According to the embodiment described above, even if a Hf-doped $Al_2O_3$ film is formed by adding (doping) a small amount of Hf into an $Al_2O_3$ film and is thermally treated at about 1000° C., the Hf-doped $Al_2O_3$ film may not be crystallized and may be maintained in an amorphous state. When the Hf-doped $Al_2O_3$ film as described above is used as an insulating film, i.e., a blocking insulating film, of a charge-trap type flash memory or the like, a semiconductor device such as a charge-trap type flash memory in which a change in a threshold voltage is suppressed may be manufactured.

Additional Embodiments of the Present Invention

Although an embodiment of the present invention has been described above in detail, the present invention is not limited thereto and various changes may be made in form and details without departing from the spirit and scope of the invention.

In the above embodiment, a case in which an insulating film is formed on a substrate using an Al-containing gas containing aluminum (Al) as a first element has been described above. However, the present invention is not limited thereto and a gas containing at least one element selected from the group consisting of aluminum (Al), yttrium (Y), and lanthanum (La) may be used as the first element.

In the above embodiment, a case in which hafnium (Hf) is added as a second element into an insulating film using a Hf-containing gas containing Hf as the second element has been described above. However, any of various other elements having an atomic radius that is greater than that of the first element may be used as the second element. According to the present invention, at least one element selected from the group consisting of hafnium (Hf), zirconium (Zr), yttrium (Y), lanthanum (La), niobium (Nb), tantalum (Ta), strontium (Sr), titanium (Ti), and silicon (Si) may be used as the second element.

In the above embodiment, a case in which TMA gas is used as an Al-containing gas to form the $Al_2O_3$ film has been described above. However, the present invention is not limited thereto and a gas containing Al and a chloro group, e.g., aluminum trichloride ($AlCl_3$), or a gas containing Al and a fluoro group, e.g., aluminum trifluoride ($AlF_3$), may be used as the Al-containing gas.

Also, in the above embodiment, a case in which TDMAH gas is used as a Hf-containing gas to form a $HfO_2$ film has been described above. However, the present invention is not limited thereto and, for example, TEMAH [Hf(NEtMe)$_4$ or tetrakis (ethylmethylamino)hafnium], Hf(O-tBu)$_4$, TDEAH [Hf(NEt$_2$)$_4$ or tetrakis(ethylmethylamino)hafnium], Hf(MMP)$_4$, hafnium tetrachloride (HfCl$_4$), etc. may be used as the Hf-containing gas (Hf-containing source).

Also, in the above embodiment, a case in which $O_3$ gas is used as an O-containing gas has been described above, but the present invention is not limited thereto and, for example, $O_2$ gas, nitrous oxide ($N_2O$) gas, nitrogen monoxide (NO) gas, nitrogen dioxide ($NO_2$) gas, hydrogen ($H_2$) gas+oxygen ($O_2$) gas, ozone ($O_3$) gas, vapor ($H_2O$) gas, carbon monoxide (CO) gas, or carbon dioxide ($CO_2$) gas may be used as the O-containing gas.

Also, in the above embodiment, a case in which a $HfO_2$ film is formed as an additive by using a Hf-containing gas as a second source gas has been described above, but the present invention is not limited thereto and, for example, a $ZrO_2$ film may be formed as an additive by using a Zr-containing gas as the second source gas. In this case, for example, TDMAZ (Zr[N(CH$_3$)$_2$]$_4$; tetrakis(dimethylamino)zirconium), TEMAZ (Zr(NEtMe)$_4$; tetrakis(ethylmethylamino)zirconium), Zr(O-tBu)$_4$, TDEAZ (Zr(NEt$_2$)$_4$; tetrakis(diethylamino) zirconium], Zr(MMP)$_4$, or zirconium tetrachloride (ZrCl$_4$) may be used as the Zr-containing gas (Zr-containing source).

Also, in the above embodiment, a case in which $N_2$ gas is used as an inert gas has been described above, but the present invention is not limited thereto and, for example, a rare gas such as Ar gas, He gas, Ne gas, or Xe gas may be used.

In the above embodiment, a case in which an $Al_2O_3$ film is used as an insulating film has been described above, but the present invention is not limited thereto and, for example, an oxide film such as an $Y_2O_3$ film (yttrium oxide film) or a $La_2O_3$ film (lanthanum oxide film) may be used as the insulating film.

Also, in the above embodiment, a case in which a $HfO_2$ film is used as a film to be added (additive) has been described above, but the present invention is not limited thereto and, for example, an $Y_2O_3$ film (yttrium oxide film), a $La_2O_3$ film (lanthanum oxide film), a $ZrO_2$ film (zirconium oxide film), a NbO film (niobium oxide film), a $Ta_2O_5$ film (tantalum oxide film), a SrO film (strontium oxide film), a $TiO_2$ film (titanium oxide film), or a $SiO_2$ film (silicon oxide film) may be used as the additive.

The Hf-doped $Al_2O_3$ film obtained according to the above embodiment may be used as an insulating film (particularly, a blocking insulating film) of a flash memory.

The Hf-doped $Al_2O_3$ film obtained according to the above embodiment may also form a part of a semiconductor device that includes a gate electrode.

In the above embodiment, film-forming sequences or modified examples or application examples thereof may be appropriately combined and used.

Also, the present invention may be achieved by changing, for example, a process recipe of a conventional substrate processing apparatus. In order to change the process recipe of the conventional substrate processing apparatus, a process recipe according to the present invention may be installed in the conventional substrate processing apparatus via an electrical communication line or a recording medium storing the process recipe, or the process recipe installed in the conventional substrate processing apparatus may be replaced with the process recipe according to the present invention by manipulating an I/O device of the conventional substrate processing apparatus.

EXAMPLE

Figure 7:
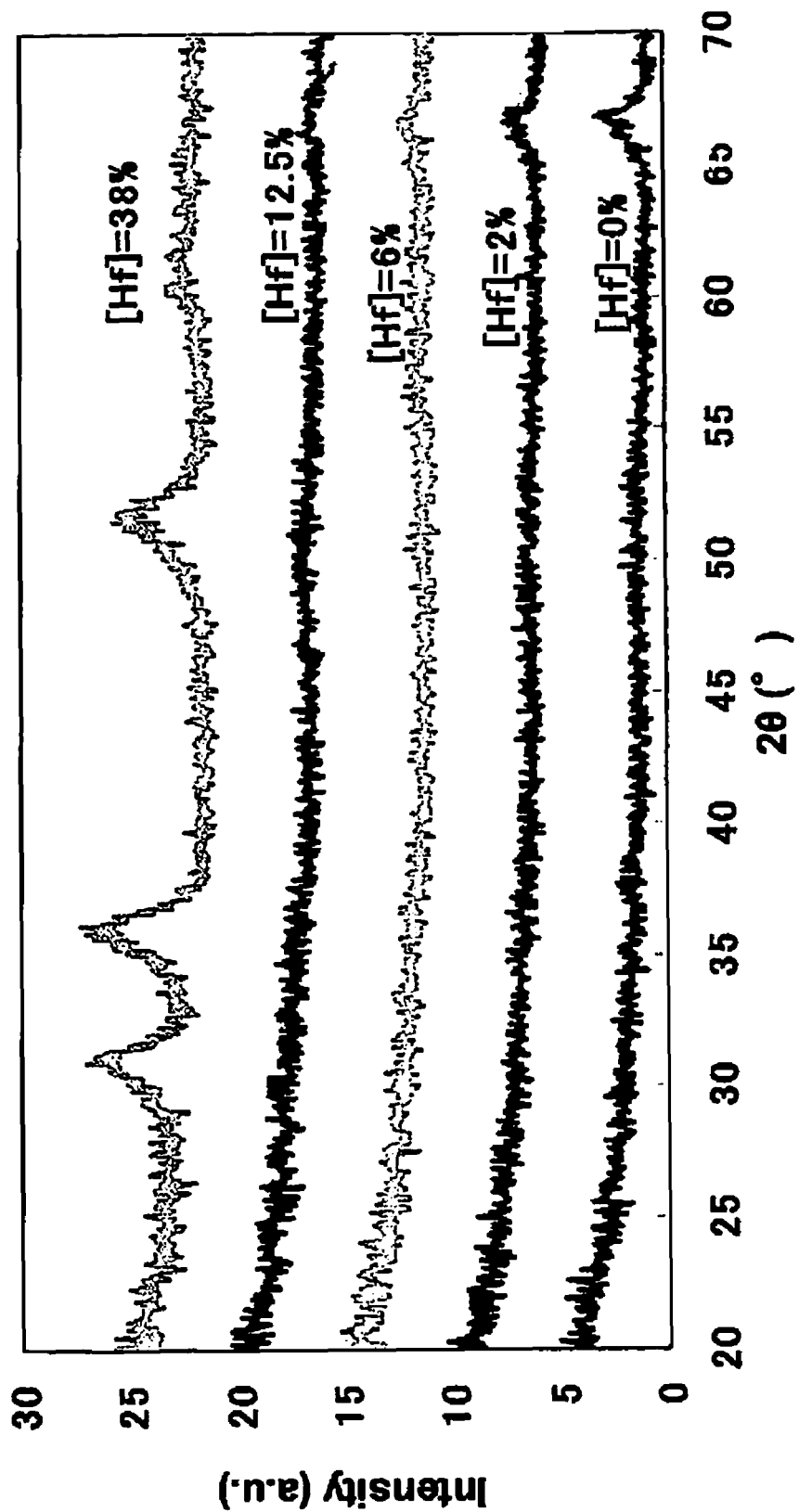
FIG. 7 is a graph illustrating a result of evaluating a film obtained by performing a film-forming process according to an exemplary example of the present invention.

Evaluation samples were prepared as embodiments of the present invention by forming a Hf-doped $Al_2O_3$ film on wafers using the film-forming sequence and the substrate processing apparatus according to the embodiment described above, while changing the concentration of Hf to be doped. In this case, the concentration of Hf to be doped was changed to 0%, 2%, 6%, 12.5% and 38%. Then, the evaluation samples were thermally treated at about 1000° C., and a crystallization evaluation was performed thereon using X-ray diffraction (XRD). Spectrums indicating evaluation results are illustrated in FIG. 7. In FIG. 7, a vertical axis denotes a diffraction intensity expressed in an arbitrary unit (a.u.), and a horizontal axis denotes a diffraction angle 2θ(°). Referring to FIG. 7, it was revealed that the film had a peak value and was crystallized when the concentration of Hf contained in the Hf-doped $Al_2O_3$ film was 0%, i.e., when an $Al_2O_3$ film where no $HfO_2$ film was doped was thermally treated at about 1000° C. When Hf was doped into the $Al_2O_3$ film, the degree of crystallization was changed. The film had a low peak value when the concentration of Hf was 6% and hardly had a peak value when the concentration of Hf was 12.5%, thereby maintaining the resultant film in an amorphous state. When the concentration of Hf was 38%, the film had peak values indicating that the $HfO_2$ film was crystallized. As described above, when Hf was doped into the $Al_2O_3$ film at a concentration of about 2 to 38%, and particularly, an appropriate concentration, e.g., 12%, the $Al_2O_3$ film was maintained in the amorphous state even when the resultant Hf-doped $Al_2O_3$ film was thermally treated at about 1000° C. Here, the crystallization temperature of the $Al_2O_3$ film was about 900° C., and the crystallization temperature of the $HfO_2$ film was about 400° C. to 500° C. According to the present invention, using the $Al_2O_3$ film as a base film, the $HfO_2$ film, the crystallization temperature of which was lower than the $Al_2O_3$ film, was added to the $Al_2O_3$ film at a predetermined concentration, thereby increasing the crystallization temperature from that when a single $Al_2O_3$ film was used. When the $HfO_2$ film was set to a base film and the $Al_2O_3$ film was added thereto, the $HfO_2$ film was crystallized similar to when the concentration of Hf was high as illustrated in FIG. 7. The $Al_2O_3$ film had a band gap of about 8.7 to 9.0 eV and the $HfO_2$ film had a band gap of about 5.5 to 6.0 eV. Thus, a band gap of an insulating film when the $HfO_2$ film was set to a base film was narrower than when the $Al_2O_3$ film was set to a base film.

According to the present invention, a substrate processing apparatus and method configured to manufacture a semiconductor device such as a charge-trap type flash memory in which a threshold voltage is suppressed from changing, a method of manufacturing a semiconductor device, a non-transitory computer-readable recording medium, and the semiconductor device are provided.

Additional Exemplary Embodiments of the Present Invention

Additional exemplary embodiments of the present invention will now be described.

Supplementary Note 1

According to an aspect of the present invention, there is provided a method of manufacturing a semiconductor device, the method including forming an amorphous first oxide film including a first element on a substrate, and modifying the first oxide film to an amorphous second oxide film including the first element and a second element different from the first element by adding the second element to the first oxide film, wherein the first element includes at least one element selected from the group consisting of aluminum, yttrium and lanthanum, and a concentration of the second element in the second oxide film is lower than that of the first element in the second oxide film.

Supplementary Note 2

In the method according to supplementary note 1, the concentration of the second element in the second oxide film is preferably equal to or lower than 40%.

Supplementary Note 3

In the method according to supplementary note 1 or 2, the concentration of the second element in the second oxide film is preferably higher than 2% and lower than 38%.

Supplementary Note 4

In the method according to one of supplementary notes 1 to 3, the concentration of the second element in the second oxide film is preferably about 12%.

Supplementary Note 5

In the method according to one of supplementary notes 1 to 4, the second oxide film is preferably formed to a desired thickness by repeating the process of forming the first oxide film and the process of modifying the first oxide film to the second oxide film a predetermined number of times.

Supplementary Note 6

In the method according to supplementary note 5, the concentration of the second element in the second oxide film is preferably controlled to have a desired value by controlling a ratio between a number of times the process of forming the first oxide film is performed and a number of times the process of modifying the first oxide film to the second oxide film is performed.

Supplementary Note 7

In the method according to one of supplementary notes 1 to 6, the second element preferably includes at least one element selected from the group consisting of hafnium, zirconium, yttrium, lanthanum, niobium, tantalum, strontium, titanium and silicon.

Supplementary Note 8

In the method according to one of supplementary notes 1 to 7, it is preferable that the first element be aluminum, the second element be hafnium or zirconium, the first oxide film be an aluminum oxide film, and the second oxide film be an aluminum hafnium oxide film or aluminum zirconium oxide film.

Supplementary Note 9

In the method according to one of supplementary notes 1 to 8, the second oxide film is preferably maintained in an amorphous state even when the second oxide film is heated to 1000° C.

Supplementary Note 10

In the method according to one of supplementary notes 1 to 9, the second oxide film is preferably used as a blocking insulating film of a flash memory.

Supplementary Note 11

In the method according to one of supplementary notes 1 to 10, the process of forming the first oxide film preferably includes at least exposing the substrate to a first source gas including the first element, removing the first source gas remaining on the substrate, exposing the substrate to a first oxygen-containing gas, and removing the first oxygen-containing gas remaining on the substrate; the first oxide film is formed on the substrate to the desired thickness by performing these processes a predetermined number of times; the process of modifying the first oxide film to the second oxide film includes at least exposing the substrate on which the first oxide film is formed to a second source gas that includes the second element and that is different from the first source gas, removing the second source gas remaining on the substrate, exposing the substrate to a second oxygen-containing gas, and removing the second oxygen-containing gas remaining on the substrate; the first oxide film is modified into the second oxide film by performing these processes a predetermined number of times; and a concentration of the second element in the second oxide film is controlled to have a desired value by performing the process of forming the first oxide film and the process of modifying the first oxide film to the second oxide film a predetermined number of times.

Supplementary Note 12

In the method according to supplementary note 11, the first oxygen-containing gas and the second oxygen-containing gas are preferably the same oxygen-containing gas.

Supplementary Note 13

In the method according to supplementary note 11 or 12, the first oxygen-containing gas and the second oxygen-containing gas are preferably each an oxygen-containing gas selected from the group consisting of $O_2$ gas, $N_2O$ gas, NO gas, $NO_2$ gas, $H_2$ gas+$O_2$ gas, $O_3$ gas, $H_2O$ gas, CO gas and $CO_2$ gas.

Supplementary Note 14

In the method according to one of supplementary notes 11 to 13, the second element preferably includes at least one element selected from the group consisting of hafnium, zirconium, yttrium, lanthanum, niobium, tantalum, strontium, titanium and silicon.

Supplementary Note 15

According to another aspect of the present invention, there is provided a substrate processing method including forming an amorphous first oxide film including a first element on a substrate, and modifying the first oxide film to an amorphous second oxide film including the first element and a second element different from the first element by adding the second element to the first oxide film, wherein the first element includes at least one element selected from the group consisting of aluminum, yttrium and lanthanum, and a concentration of the second element in the second oxide film is lower than that of the first element in the second oxide film.

Supplementary Note 16

According to another aspect of the present invention, there is provided a substrate processing apparatus including a process chamber configured to accommodate a substrate therein; a first source gas supply system configured to supply a first source gas including a first element, which is at least one element selected from the group consisting of aluminum, yttrium and lanthanum, onto the substrate accommodated in the process chamber; a second source gas supply system configured to supply a second source gas including a second element different from the first element onto the substrate in the process chamber; an oxygen-containing gas supply system configured to supply an oxygen-containing gas onto the substrate in the process chamber; and a control unit configured to control the first source gas supply system, the second source gas supply system and the oxygen-containing gas supply system to form the amorphous first oxide film including the first element on the substrate in the process chamber by supplying the first source gas and the oxygen-containing gas onto the substrate and to modify the first oxide film to the amorphous second oxide film including the first and second elements by adding the second element to the first oxide film by supplying the second source gas onto the substrate.

Supplementary Note 17

In the substrate processing apparatus according to supplementary note 16, the control unit is preferably configured to control the first source gas supply system, the second source gas supply system and the oxygen-containing gas supply system to set the second element in the first oxide film to have a desired concentration.

Supplementary Note 18

In the substrate processing apparatus according to supplementary note 16 or 17, the control unit is preferably configured to control the first source gas supply system, the second source gas supply system and the oxygen-containing gas supply system to set the concentration of the second element in the first oxide film to be lower than that of the first element in the first oxide film.

Supplementary Note 19

According to another aspect of the present invention, there is provided a program causing a computer to perform forming a first oxide film including a first element, which is at least one element selected from the group consisting of aluminum, yttrium and lanthanum, on a substrate accommodated in a process chamber of a substrate processing apparatus, and adding a second element different from the first element into the first oxide film formed on the substrate such that a concentration of the second element in the first oxide film is lower than that of the first element in the first oxide film.

Supplementary Note 20

According to another aspect of the present invention, there is provided a non-transitory computer-readable recording medium storing the program of supplementary note 19.

Supplementary Note 21

According to another aspect of the present invention, there is provided a substrate processing apparatus including the non-transitory computer-readable recording medium of supplementary note 20.

Supplementary Note 22

According to another aspect of the present invention, there is provided a semiconductor device including a gate electrode and an insulating film which is an amorphous second oxide film in which a second element different from a first element is added at a predetermined concentration into a first oxide film including the first element which is at least one element selected from the group consisting of aluminum, yttrium and lanthanum.

Supplementary Note 23

According to another aspect of the present invention, there is provided a semiconductor manufacturing apparatus and method by which an $Al_2O_3$ film is able to be formed as an insulating film of a flash memory by adding another element into the $Al_2O_3$ film so that the $Al_2O_3$ film may be maintained in an amorphous state after the $Al_2O_3$ film is thermally treated at a high temperature.

Supplementary Note 24

In the semiconductor manufacturing apparatus and method according to supplementary note 23, the other element added into the $Al_2O_3$ film has an atomic radius greater than that of aluminum.

Supplementary Note 25

In the semiconductor manufacturing apparatus and method according to supplementary note 23 or 24, the other element added into the $Al_2O_3$ film is HfO.

Although various typical embodiments of the present invention have been described above, the present invention is not limited thereto and the scope of the present invention is defined only by the appended claims.

What is claimed is:

1. A method of forming a hafnium-doped aluminum oxide film in the process of manufacturing a semiconductor device, comprising:
   (a) forming an aluminum first oxide film in an amorphous state;
   (b) forming a hafnium oxide film; and
   (c) repeating (a) and (b) a predetermined number of times to form the hafnium-doped aluminum oxide film in an amorphous state on a previously formed layer of the semiconductor device, wherein (a) is performed m times and (b) is performed n times to control a concentration of hafnium to be lower than that of aluminum in the hafnium-doped aluminum oxide film, where n>m>1.

2. The method of claim 1, wherein the concentration of hafnium in the hafnium-doped aluminum oxide film is controlled to be equal to or lower than 40% in (c).

3. The method of claim 1, wherein the concentration of hafnium in the hafnium-doped aluminum oxide film is controlled to be higher than 2% and lower than 38% in (c).

4. The method of claim 1, wherein the concentration of hafnium in the hafnium-doped aluminum oxide film is controlled to be substantially 12%.

5. The method of claim 1, wherein (a) and (b) are repeated the predetermined number of times to form the hafnium-doped aluminum oxide film having a predetermined thickness in (c).

6. The method of claim 1, wherein the concentration of hafnium is selected in a manner that the hafnium-doped aluminum oxide film remains in an amorphous state after the hafnium-doped aluminum oxide film is heated to 1000° C.

7. The method of claim 1, wherein (a) comprises performing a first cycle m times, the first cycle at least including:
(a-1) exposing the semiconductor device being manufactured to a first source gas including aluminum;
(a-2) removing the first source gas remaining after performing (a-1);
(a-3) exposing the semiconductor device to a first oxygen-containing gas; and
(a-4) removing the first oxygen-containing gas remaining after performing (a-3),
wherein (b) comprises performing a second cycle n times, the second cycle at least including:
(b-1) exposing the semiconductor device to a second source gas including hafnium, the second source gas being different from the first source gas;
(b-2) removing the second source gas remaining after performing (b-1);
(b-3) exposing the semiconductor device to a second oxygen-containing gas; and
(b-4) removing the second oxygen-containing gas remaining after performing (b-3).

8. The method of claim 1, wherein the semiconductor device is a charge-trap type flash memory with a TANOS structure, and the hafnium-doped aluminum oxide film is formed as a blocking oxide film between a charge trapping film and a gate electrode of the flash memory.

9. A substrate processing apparatus comprising:
a process chamber accommodating a substrate therein;
a first source gas supply system configured to supply a first source gas including at least aluminum onto the substrate in the process chamber;
a second source gas supply system configured to supply a second source gas onto the substrate in the process chamber, wherein the second source gas includes hafnium, the second source gas being different from the first source gas;
an oxygen-containing gas supply system configured to supply an oxygen-containing gas onto the substrate in the process chamber; and
a control unit configured to control the first source gas supply system, the second source gas supply system and the oxygen-containing gas supply system to perform: (a) forming an aluminum oxide film in an amorphous state; (b) forming a hafnium oxide film; and (c) repeating (a) and (b) a predetermined number of times to form a hafnium-doped aluminum oxide film in an amorphous state on the substrate, wherein (a) is performed m times and (b) is performed n times to control a concentration of hafnium to be lower than that of aluminum in the hafnium-doped aluminum oxide film, where $n>m>1$.

10. The substrate processing apparatus of claim 9, wherein the control unit is configured to control the concentration of hafnium in the hafnium-doped aluminum oxide film to be substantially 12%.

11. The substrate processing apparatus of claim 9, wherein the control unit is configured to control the first source gas supply system, the second source gas supply system and the oxygen-containing gas supply system to:
perform (a) by performing a first cycle m times, the first cycle at least including:
(a-1) exposing the substrate to a first source gas including aluminum;
(a-2) removing the first source gas remaining after performing (a-1);
(a-3) exposing the substrate to a first oxygen-containing gas; and
(a-4) removing the first oxygen-containing gas remaining after performing (a-3); and
perform (b) by performing a second cycle n times, the second cycle at least including:
(b-1) exposing the substrate to a second source gas including hafnium, the second source gas being different from the first source gas;
(b-2) removing the second source gas remaining after performing (b-1);
(b-3) exposing the substrate to a second oxygen-containing gas; and
(b-4) removing the second oxygen-containing gas remaining after performing (b-3).

12. The substrate processing apparatus of claim 9, wherein the control unit is configured to control the first source gas supply system, the second source gas supply system and the oxygen-containing gas supply system to perform (a), (b), and (c) to form the hafnium-doped aluminum oxide film as a blocking oxide film between a charge trapping film and a gate electrode of a charge-trap type flash memory with a TANOS structure.

13. A non-transitory computer-readable recording medium storing a program that causes a computer to control a substrate processing apparatus to perform:
(a) forming an aluminum oxide film in an amorphous state;
(b) forming a hafnium oxide film; and
(c) repeating (a) and (b) a predetermined number of times to form a hafnium-doped aluminum oxide film in an amorphous state on a substrate, wherein (a) is performed m times and (b) is performed n times to control a concentration of hafnium to be lower than that of aluminum in the hafnium-doped aluminum oxide film, where $n>m>1$.

14. The non-transitory computer-readable recording medium of claim 13, storing a program that causes the computer to further control the substrate processing apparatus to control the concentration of hafnium in the hafnium-doped aluminum oxide film to be substantially 12%.

15. The non-transitory computer-readable recording medium of claim 13, storing a program that causes the computer to further control the substrate processing apparatus to:
perform (a) by performing a first cycle m times, the first cycle at least including:
(a-1) exposing the substrate to a first source gas including aluminum;
(a-2) removing the first source gas remaining after performing (a-1);
(a-3) exposing the substrate to a first oxygen-containing gas; and
(a-4) removing the first oxygen-containing gas remaining after performing (a-3); and
perform (b) by performing a second cycle n times, the second cycle at least including:
(b-1) exposing the substrate to a second source gas including hafnium, the second source gas being different from the first source gas;
(b-2) removing the second source gas remaining after performing (b-1);
(b-3) exposing the substrate to a second oxygen-containing gas; and
(b-4) removing the second oxygen-containing gas remaining after performing (b-3).

16. The non-transitory computer-readable recording medium of claim 13, storing a program that causes the computer to further control the substrate processing apparatus to form the hafnium-doped aluminum oxide film as a blocking oxide film between a charge trapping film and a gate electrode of a charge-trap type flash memory with a TANOS structure.

\* \* \* \* \*